United States Patent
Yang

(10) Patent No.: US 10,459,298 B2
(45) Date of Patent: Oct. 29, 2019

(54) DISPLAY DEVICE, ARRAY SUBSTRATE AND MANUFACTURING METHOD THEREOF

(71) Applicant: Wuhan China Star Optoelectronics Technology Co., Ltd., Wuhan, Hubei (CN)

(72) Inventor: Chengao Yang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/735,922

(22) PCT Filed: Sep. 21, 2017

(86) PCT No.: PCT/CN2017/102569
§ 371 (c)(1),
(2) Date: Dec. 12, 2017

(87) PCT Pub. No.: WO2019/019315
PCT Pub. Date: Jan. 31, 2019

(65) Prior Publication Data
US 2019/0033647 A1    Jan. 31, 2019

(30) Foreign Application Priority Data
Jul. 27, 2017  (CN) .......................... 2017 1 0626751

(51) Int. Cl.
*H01L 27/12*      (2006.01)
*G02F 1/1345*     (2006.01)
(Continued)

(52) U.S. Cl.
CPC .... *G02F 1/13454* (2013.01); *G02F 1/133345* (2013.01); *H01L 27/124* (2013.01);
(Continued)

(58) Field of Classification Search
CPC ............... H01L 27/124; H01L 27/1244; H01L 27/1248; H01L 27/3276; G02F 1/13454
See application file for complete search history.

(56) References Cited

U.S. PATENT DOCUMENTS 9,436,049 B2   9/2016  Heo et al.
9,646,559 B2   5/2017  Min et al.
(Continued)

FOREIGN PATENT DOCUMENTS

CN    104503177 A    4/2015
CN    106200162 A    12/2016
CN    106932980 A    7/2017

*Primary Examiner* — Phat X Cao
(74) *Attorney, Agent, or Firm* — Andrew C. Cheng

(57) ABSTRACT

A display device, array substrate and manufacturing method thereof are provided. The array substrate includes an active area and a non-active area, and the active area includes a plurality of scan lines and a plurality of data lines intersecting with the plurality of scan lines, and a plurality of pixel units formed by the intersecting plurality of scan lines and plurality of data lines; the non-active area includes a driving circuit providing scan signals to the scan lines, and the driving circuit is located along an extension direction of the data lines so as to reduce area size of the non-active area along an extension direction of the scan lines to achieve narrowing border size. As such, the ultra-narrow border for display device is achieved.

8 Claims, 3 Drawing Sheets

(51) Int. Cl.
*G02F 1/1333* (2006.01)
*G02F 1/1362* (2006.01)
*G02F 1/1343* (2006.01)

(52) U.S. Cl.
CPC ...... *H01L 27/1244* (2013.01); *H01L 27/1248* (2013.01); *H01L 27/1262* (2013.01); *G02F 1/13439* (2013.01); *G02F 1/136286* (2013.01); *G02F 2001/136295* (2013.01)

(56) References Cited

U.S. PATENT DOCUMENTS

| | | |
|---|---|---|
| 9,935,131 B2 | 4/2018 | Lv et al. |
| 10,168,593 B2 | 1/2019 | Hao |
| 2011/0279418 A1* | 11/2011 | Han ................. G02F 1/136286 345/204 |
| 2016/0190158 A1 | 6/2016 | Song |
| 2017/0059908 A1* | 3/2017 | Yen ....................... G02F 1/1368 |
| 2017/0084214 A1* | 3/2017 | Ono .......................... G09G 3/20 |

\* cited by examiner

DISPLAY DEVICE, ARRAY SUBSTRATE AND MANUFACTURING METHOD THEREOF

BACKGROUND OF THE INVENTION

1. Field of the Invention

The present invention relates to the field of display techniques, and in particular to a display device, array substrate and manufacturing method thereof.

2. The Related Arts

As the liquid crystal display (LCD) panel technology continues to progress, the trend of small-size panel, in particular 4-7 inch panels for cell phone, moves towards thinness, lightness, high screen ratio, ultra-narrow border, or even borderless design. The conventional low temperature poly-silicon (LTPS) panel technology pushes the border to narrow down to 0.7 mm-0.8 mm range through reducing the GOA circuit area, IC chips and gaps between routing wires. However, to ensure the GOA circuit effectiveness, panel reliability and mutual insulation among various signal lines, the border, in particular the lateral border, is reduced to approaching the limit, which is still unable to effectively realize the ultra-narrow border for panel design.

SUMMARY OF THE INVENTION

To overcome the shortcomings of the known technique, the present invention provides a display device, array substrate and manufacturing method thereof, able to achieve realizing the ultra-narrow border design for display device.

To overcome the shortcomings of the known technique, the present invention provides an array substrate, comprising: an active area and a non-active area, wherein the active area being disposed with a plurality of scan lines and a plurality of data lines intersecting with the plurality of scan lines, and a plurality of pixel units formed by the intersecting plurality of scan lines and plurality of data lines; the non-active area being disposed with a driving circuit providing scan signals to the scan lines, wherein the driving circuit being disposed along an extension direction of the data lines so as to reduce area size of the non-active area along an extension direction of the scan lines to achieve narrowing border size.

To overcome the shortcomings of the known technique, the present invention also provides a manufacturing method of array substrate, wherein the array substrate comprising an active area and a non-active area, and the manufacturing method comprising:

disposing in the active area with a plurality of scan lines and a plurality of data lines intersecting with the plurality of scan lines, and a plurality of pixel units formed by the intersecting plurality of scan lines and plurality of data lines;

disposing in the non-active area with a driving circuit providing scan signals to the scan lines, wherein the driving circuit being disposed along an extension direction of the data lines.

To overcome the shortcomings of the known technique, the present invention also provides a display device, comprising an array substrate, wherein the array substrate comprising an active area and a non-active area, the active area being disposed with a plurality of scan lines and a plurality of data lines intersecting with the plurality of scan lines, and a plurality of pixel units formed by the intersecting plurality of scan lines and plurality of data lines; the non-active area being disposed with a driving circuit providing scan signals to the scan lines, wherein the driving circuit being disposed along an extension direction of the data lines so as to reduce area size of the non-active area along an extension direction of the scan lines to achieve narrowing border size.

Compared to the known techniques, the present invention provides the following advantages: the present invention provides a display device, array substrate and manufacturing method thereof, wherein the arrays substrate comprising an active area and a non-active area, the active area being disposed with a plurality of scan lines and a plurality of data lines intersecting with the plurality of scan lines, and a plurality of pixel units formed by the intersecting plurality of scan lines and plurality of data lines; the non-active area being disposed with a driving circuit providing scan signals to the scan lines, wherein the driving circuit being disposed along an extension direction of the data lines so as to reduce area size of the non-active area along an extension direction of the scan lines to achieve narrowing border size. As such, the present invention can realize the ultra-narrow design for display device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

Figure 1:
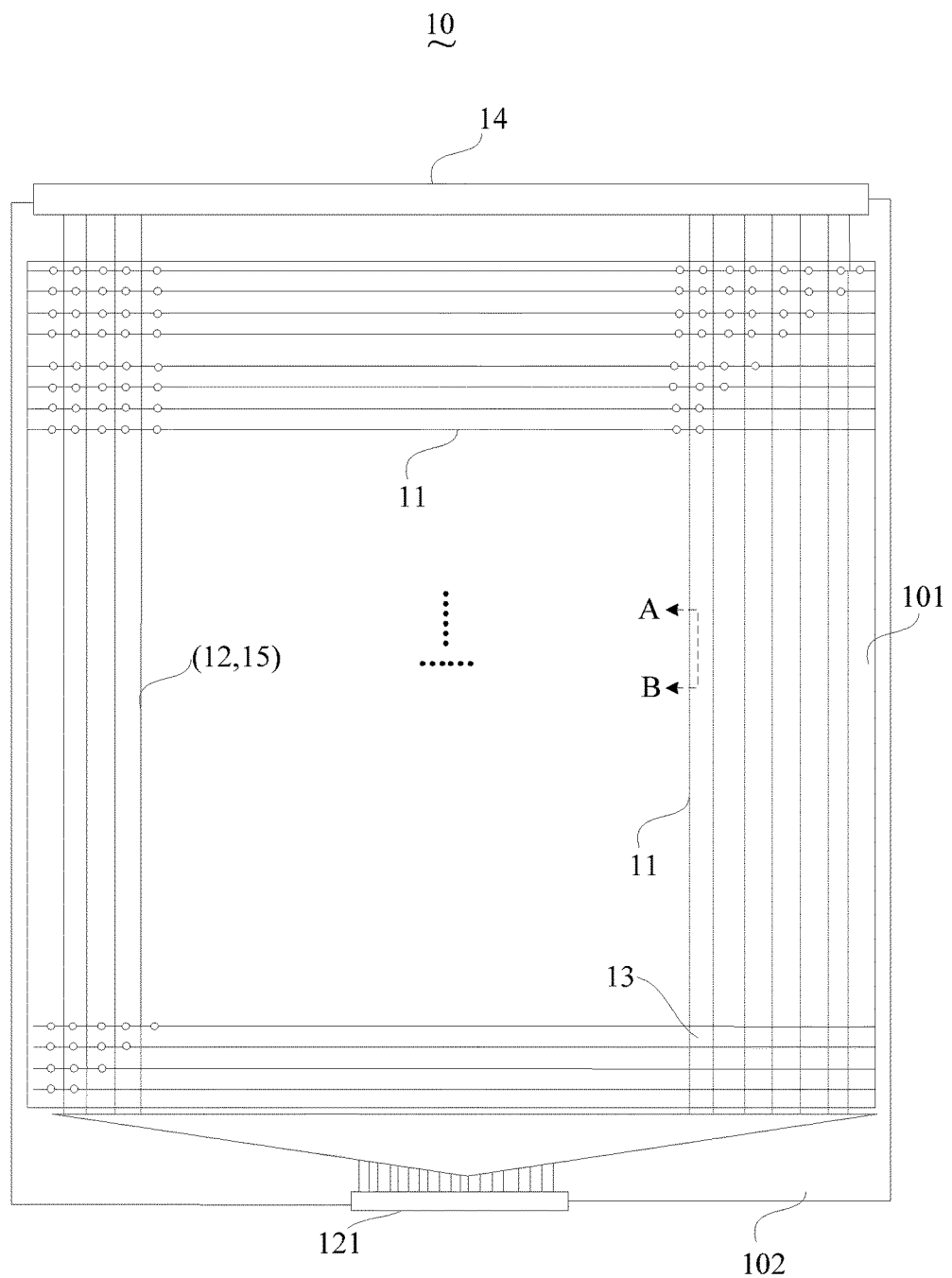
FIG. 1 is a schematic view showing the structure of an array substrate provided by an embodiment of the present invention.
Figure 2:
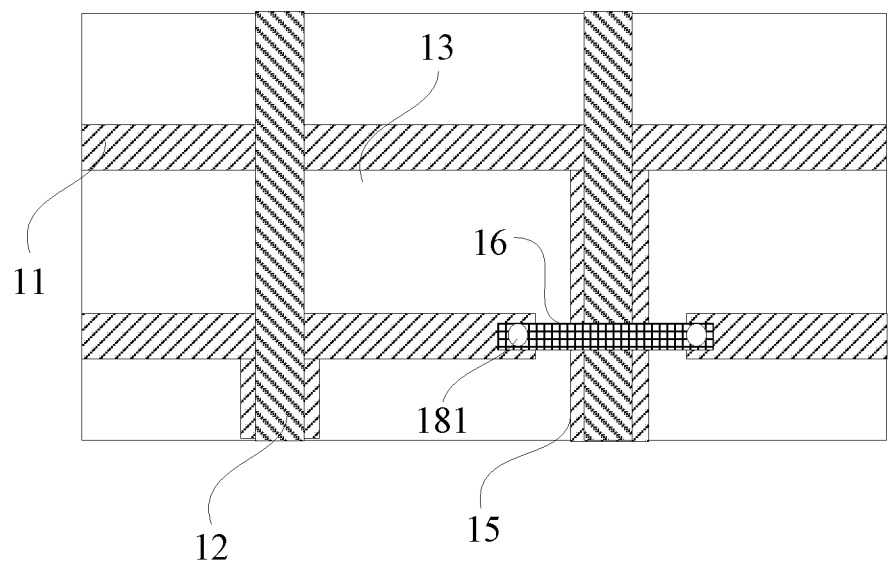
FIG. 2 is a partial schematic view showing the structure of an array substrate provided by an embodiment of the present invention.
Figure 3:
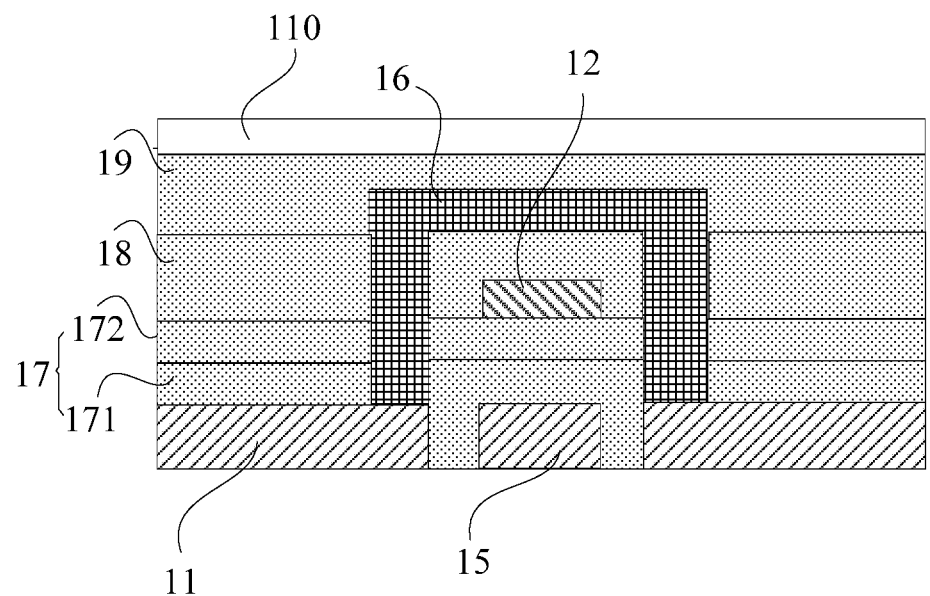
FIG. 3 is a cross-sectional view showing the structure of an array substrate provided by an embodiment of the present invention.

Refer to FIG. 1 and FIG. 3. FIG. 1 is a schematic view showing the structure of an array substrate provided by an embodiment of the present invention; FIG. 2 is a partial schematic view showing the structure of an array substrate provided by an embodiment of the present invention; and FIG. 3 is a cross-sectional view showing the structure of an array substrate provided by an embodiment of the present invention. An array substrate 10 comprises an active area 101 and a non-active area 102. Wherein, the active area 101 is disposed with a plurality of scan lines 11 and a plurality of data lines 12 intersecting with the plurality of scan lines 11, and a plurality of pixel units 13 formed by the intersecting plurality of scan lines 11 and plurality of data lines 12; and the non-active area 102 is disposed with a driving circuit 14 providing scan signals to the scan lines 11 and a driving circuit 15 for providing data voltage signal to data lines 12. The non-active area 102 along the extension direction of the scan lines 11 is disposed with only the signal lines for GOA circuit, such as, Clk signal line, VGL signal line, VGH signal line, XClk signal line, Reset signal line, STV signal line, and GND signal line so as to reduce the area size of the non-active area along the scan lines 11 to the extreme to achieve narrowing the border. The border of the display device formed by the array substrate 10 of the present invention can be reduced to 0.1 mm-0.3 mm. This type of structure can co-exist with the planar capacitive in-cell touch technology to effectively realize the ultra-thin and ultra-narrow border design of the display device.

In the present embodiment, the array substrate 10 further comprises a plurality of first connection lines 15 and a plurality of second connection lines 1. The first connection lines 15 are for connecting the driving circuit 14 and the scan lines 11, wherein each first connection line 15 is connected to a pre-set scan line 11. As shown in the embodiment of FIG. 1, each first connection line 15 is connected to a scan line 11. In other embodiments, depending on the driving approach, each first connection line 15 can be connected to two or different number of scan lines 11.

In the present embodiment, the first connection lines 15 and the scan lines 11 are disposed at the same layer, and the first connection lines 15 and the data lines 12 are disposed in parallel. Moreover, the data lines 12 are disposed above the scan lines 11 and the first connection lines 15. The projections of the first connection lines 15 overlap the projections of and the date lines 12.

The second connection lines 16 are disposed above the scan lines 11 and the first connection lines 15. Except the scan line 11 farthest away from the driving circuit 14, the other scan lines 11 are broken at the crossing with the first connection lines 15 not connected to the scan lines 11 themselves, and the two ends of the broken scan lines 11 are connected by the second connection lines 16 respectively.

As such, the same mask can be used during manufacturing scan lines 11 to manufacture the first connection lines 15; that is, ensuring the provision of the driving signal to the scan lines without adding a mask process. On the other hand, the first connection line 15 re disposed at the same layer as the scan lines 11, and overlap with the data lines 12; thus, no additional signal lines are required, and the aperture ratio can be kept high. Moreover, the first connect ion lines 15 and the data lines 12 are disposed in parallel. Thus, during displaying, the coupling capacitance will only occur between the additional first connection lines 11 for providing driving signals and corresponding data lines 12. Because the driving by the first connection lines 15 is performed in time division manner, the number of signal lines generating coupling noise is limited and has less impact on the display device.

In the present embodiment, the array substrate 10 further comprises a first insulation layer 17, a second insulation layer 18, a third insulation layer 19, and a pixel electrode 110.

Wherein, the first insulation layer 17 is disposed between the scan lines 11 and first connection lines 15 and the data lines 12. The first insulation layer 17 comprises a PLN insulation layer 171 and ILD insulation layer 172.

The second connection lines 16 are disposed above the data lines 12. The second insulation layer 18 is disposed between the data lines 12 and the second connection lines 16, and the second insulation layer 18 is disposed with vias 181. The vias 181 penetrate the second insulation layer 18 and the first insulation layer 17 to expose the two ends, the second connection lines 16 are electrically connected to the two ends through the vias.

The third insulation layer 19 is disposed above the second connection lines 16. The pixel electrode 110 is disposed above the third insulation layer 19.

Wherein, the first insulation layer 17, the second insulation layer 18, and the third insulation layer 19 can be made of the same material, such as, silicon carbide insulating material.

Figure 4:
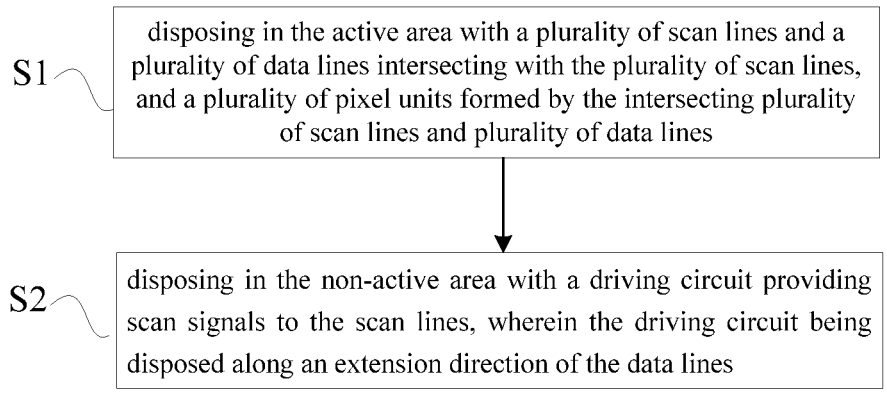
FIG. 4 is a schematic view showing the flowchart of a manufacturing method of array substrate provided by an embodiment of the present invention.
Figure 5:
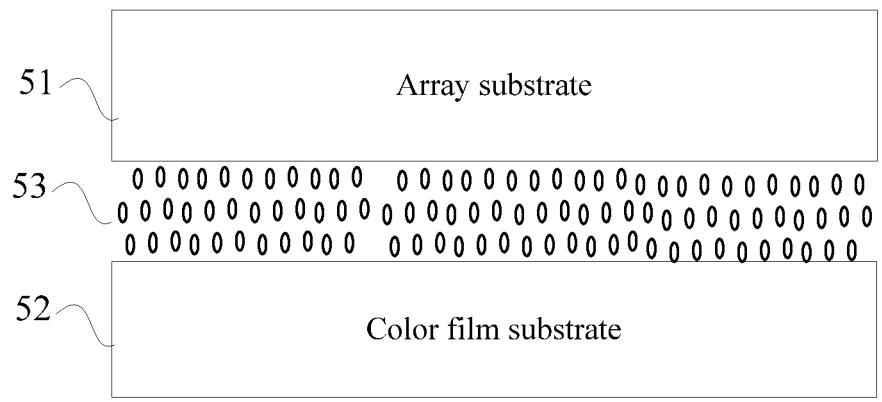
FIG. 5 is a schematic view showing the showing the structure of a display device provided by an embodiment of the present invention.

The present invention further provides a manufacturing method of array substrate. Refer to FIG. 4, wherein the array substrate is the array substrate 10 described above, and also refer to FIG. 1 and FIG. 3. Wherein, the array substrate 10 comprises an active area and a non-active area, and the manufacturing method comprises:

Step S1: disposing in the active area with a plurality of scan lines 11 and a plurality of data lines 12 intersecting with the plurality of scan lines 11, and a plurality of pixel units 13 formed by the intersecting plurality of scan lines 11 and plurality of data lines 12.

Specifically, in Step S1, a glass substrate is provided. Then, a plurality of scan lines 11 and a plurality of first connection lines 15 are disposed on the glass substrate. The first connection lines 15 are for connecting the driving circuit 14 and the scan lines 11. Specifically, each first connection line 15 is connected to a pre-set scan line 11. Except the scan line 11 farthest away from the driving circuit 14, the other scan lines 11 are broken at the crossing with the first connection lines 15 not connected to the scan lines 11 themselves.

The first insulation layer 17 is disposed above the scan lines 11 and the first connection lines 15. A plurality of data lines 12 are disposed above the first insulation layer 17, wherein the projections of the first connection lines 15 overlap the projections of the data lines 12.

Moreover, the second insulation layer 18 is disposed above the data lines 12, and the second insulation layer 18 is disposed with vias 181. The vias 181 penetrate the second insulation layer 18 and the first insulation layer 17 to expose the two ends.

Furthermore, the second connection lines 16 are disposed above the second insulation layer 18, and the second connection lines 16 connect the two ends of the broken scan lines 11 through the vias 181.

Furthermore, the third insulation layer 19 is disposed above the second connection lines 16, and the pixel electrode 110 is disposed above the third insulation layer 19.

Step S2: disposing in the non-active area with a driving circuit 14 providing scan signals to the scan lines 11, wherein the driving circuit 14 being disposed along an extension direction of the data lines 12.

The present invention further provides a display device 50. The display device 50 comprises an array substrate 51, a color film substrate 52, and a liquid crystal layer 53 disposed between the array substrate 51 and the color film substrate 52, wherein the array substrate 51 is the array substrate described above, and the description will not be repeated here.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising: an active area and a non-active area, wherein the active area being disposed with a plurality of scan lines and a plurality of data lines intersecting with the plurality of scan lines, and a plurality of pixel units formed by the intersecting plurality of scan lines and plurality of data lines; the non-active area being disposed with a driving circuit providing scan signals to the scan lines, wherein the driving circuit being disposed along an extension direction of the data lines so as to reduce area size of the non-active area along an extension direction of the scan lines to achieve narrowing border size;
   wherein the array substrate further comprises a plurality of first connection lines, for connecting the driving circuit and the scan lines; and
   wherein the first connection lines and the scan lines are disposed at the same layer, and the first connection lines and the data lines are disposed in parallel;
   the array substrate further comprises second connection lines, and the second connection lines are disposed above the scan lines and the first connection lines;
   each first connection line is electrically connected to a pre-set scan line; except the scan line farthest away from the driving circuit, the other scan lines are broken at the crossing with the first connection lines not connected to the scan lines themselves, and two ends of the broken scan lines are connected by the second connection lines.

2. The array substrate as claimed in claim 1, wherein the data lines are disposed above the scan lines and the first connection lines; the first connection lines have projections overlap projections of the date lines.

3. The array substrate as claimed in claim 2, wherein the second connection lines are disposed above the data lines.

4. The array substrate as claimed in claim 1, wherein the array substrate further comprises:
   a first insulation layer, disposed between the scan lines and first connection lines and the data lines;
   a second insulation layer, disposed between the data lines and the second connection lines, and the second insulation layer being disposed with vias; the vias penetrating the second insulation layer and the first insulation layer to expose the two ends of the broken scan lines, the second connection lines being electrically connected to the two ends of the broken scan lines through the vias;
   a third insulation layer, disposed above the second connection lines; and
   a pixel electrode, disposed above the third insulation layer.

5. A display device, comprising: an array substrate, the array substrate further comprising: an active area and a non-active area, wherein the active area being disposed with a plurality of scan lines and a plurality of data lines intersecting with the plurality of scan lines, and a plurality of pixel units formed by the intersecting plurality of scan lines and plurality of data lines; the non-active area being disposed with a driving circuit providing scan signals to the scan lines, wherein the driving circuit being disposed along an extension direction of the data lines so as to reduce area size of the non-active area along an extension direction of the scan lines to achieve narrowing border size;
   wherein the array substrate further comprises a plurality of first connection lines, for connecting the driving circuit and the scan lines; and
   the first connection lines and the scan lines are disposed at the same layer, and the first connection lines and the data lines are disposed in parallel;
   the array substrate further comprises second connection lines, and the second connection lines are disposed above the scan lines and the first connection lines;
   each first connection line is electrically connected to a pre-set scan line; except the scan line farthest away from the driving circuit, the other scan lines are broken at the crossing with the first connection lines not connected to the scan lines themselves, and two ends of the broken scan lines are connected by the second connection lines.

6. The display device as claimed in claim 5, wherein the data lines are disposed above the scan lines and the first connection lines; the first connection lines have projections overlap projections of the date lines.

7. The display device as claimed in claim 6, wherein the second connection lines are disposed above the data lines.

8. The array substrate as claimed in claim 5, wherein the array substrate further comprises:
   a first insulation layer, disposed between the scan lines and first connection lines and the data lines;
   a second insulation layer, disposed between the data lines and the second connection lines, and the second insulation layer being disposed with vias; the vias penetrating the second insulation layer and the first insulation layer to expose the two ends of the broken scan lines, the second connection lines being electrically connected to the two ends of the broken scan lines through the vias;
   a third insulation layer, disposed above the second connection lines; and
   a pixel electrode, disposed above the third insulation layer.

* * * * *